(12) United States Patent
Takemura

(10) Patent No.: US 8,513,773 B2
(45) Date of Patent: Aug. 20, 2013

(54) CAPACITOR AND SEMICONDUCTOR DEVICE INCLUDING DIELECTRIC AND N-TYPE SEMICONDUCTOR

(75) Inventor: Yasuhiko Takemura, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/346,172

(22) Filed: Jan. 9, 2012

(65) Prior Publication Data

US 2012/0193759 A1    Aug. 2, 2012

(30) Foreign Application Priority Data

Feb. 2, 2011    (JP) ................ 2011-020493

(51) Int. Cl.
| H01L 29/00 | (2006.01) |
| H01L 29/76 | (2006.01) |
| H01L 29/94 | (2006.01) |
| H01L 31/062 | (2012.01) |
| H01L 31/113 | (2006.01) |
| H01L 31/119 | (2006.01) |
| H01L 27/108 | (2006.01) |

(52) U.S. Cl.
USPC ...... 257/532; 257/300; 257/407; 257/E27.042

(58) Field of Classification Search
USPC .................. 257/300, 407, E27.042, 532
See application file for complete search history.

(56) References Cited

U.S. PATENT DOCUMENTS

| 5,364,807 A | 11/1994 | Hwang |
| 5,731,856 A | 3/1998 | Kim et al. |
| 5,744,864 A | 4/1998 | Cillessen et al. |
| 5,764,562 A | 6/1998 | Hamamoto |
| 5,802,000 A | 9/1998 | Hamada |
| 5,877,522 A | 3/1999 | Kasai |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |

(Continued)

FOREIGN PATENT DOCUMENTS

| EP | 1 737 044 A1 | 12/2006 |
| EP | 2 226 847 A2 | 9/2010 |

(Continued)

OTHER PUBLICATIONS

John Robertson; "Band offsets of wide-band-gap oxides and implications for future electronic devices"; J. Vac. Sci. Technol. B (Journal of Vacuum Science & Technology B); 2000; pp. 1785-1791; vol. 18, No. 3.

(Continued)

*Primary Examiner* — Ida M Soward
(74) *Attorney, Agent, or Firm* — Fish & Richardson P.C.

(57) ABSTRACT

A capacitor that has an electrode of an n-type semiconductor that is provided in contact with one surface of a dielectric, has a work function of 5.0 eV or higher, preferably 5.5 eV or higher, and includes nitrogen and at least one of indium, tin, and zinc. Since the electrode has a high work function, the dielectric can have a high potential barrier, and thus even when the dielectric is as thin as 10 nm or less, a sufficient insulating property can be maintained. In particular, a striking effect can be obtained when the dielectric is formed of a high-k material.

18 Claims, 7 Drawing Sheets

(56) References Cited

U.S. PATENT DOCUMENTS

| | | | |
|---|---|---|---|
| 6,793,388 B2 | 9/2004 | Matsumoto | |
| 6,890,807 B2* | 5/2005 | Chau et al. | 438/199 |
| 7,049,190 B2 | 5/2006 | Takeda et al. | |
| 7,061,014 B2 | 6/2006 | Hosono et al. | |
| 7,064,313 B1* | 6/2006 | Mann et al. | 250/214.1 |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 7,772,053 B2 | 8/2010 | Kameshiro et al. | |
| 8,168,964 B2* | 5/2012 | Hiura et al. | 257/9 |
| 8,189,397 B2* | 5/2012 | Eitan et al. | 365/185.25 |
| 8,299,507 B2* | 10/2012 | Shimizu et al. | 257/288 |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046189 A1* | 3/2007 | Hatwar et al. | 313/506 |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0114616 A1* | 5/2007 | Manger et al. | 257/407 |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2007/0290264 A1 | 12/2007 | Sugii et al. | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0250755 A1 | 10/2009 | Ohmi et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2011/0042649 A1* | 2/2011 | Duvall et al. | 257/27 |
| 2011/0227074 A1 | 9/2011 | Kato et al. | |
| 2011/0269276 A1* | 11/2011 | Kwon et al. | 438/199 |
| 2011/0298061 A1* | 12/2011 | Siddiqui et al. | 257/410 |
| 2012/0043617 A1* | 2/2012 | Nakagawa et al. | 257/369 |
| 2012/0045892 A1* | 2/2012 | Sengoku | 438/592 |
| 2012/0119302 A1* | 5/2012 | Pei et al. | 257/382 |
| 2012/0127796 A1* | 5/2012 | Eitan et al. | 365/185.15 |
| 2012/0139015 A1* | 6/2012 | Yu et al. | 257/288 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | 2004/114391 A1 | 12/2004 |

OTHER PUBLICATIONS

R.E. Jones et al.; "Evidence for p-Type Doping of InN"; Physical Review Letters; 2006; pp. 125505-1-125505-4; vol. 96.

Masaki Nakamura et al.; "The Phase Relations in the In2O3-Ga2ZnO4-ZnO system at 1350° C."; Journal of Solid State Chemistry; 1991; pp. 298-315; vol. 93.

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using Castep," Zeitschrift fur Kristallographie, 2005, vol. 220, pp. 567-570.

Coates. D et al., Optical Studies of the Amorphous Liquid-Cholesteric Liquid Crystal Transition: The "Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In-Ga-Zn-O TFTs for Flat Panel Displays,"AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In-Ga-Zn-Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In-Ga-Zn-Oxide TFT," AM-FPD '09 Digest of Technical Papers, Jul. 1, 2009, pp. 41-44.

Hayashi, R et al., "42.1: Invited Paper: Improved Amorphous In-Ga-Zn-O TFTs," SID Digest '08 : SID International Symposium Digest of Technical Papers, May 20, 2008, vol. 39, pp. 621-624.

Hirao, Tet al., "Novel Top-Gate Zinc Oxide Thin-Film Transistors (ZnO TFTs) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancles in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 As a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N. et al., "Spinel,YBFE2O4, and YB2FE3O7 Types of Structures for Compounds in the IN2O3 and SC2O3-A2O3-BO Systems [A; Fe, Ga, or Al; B: Mg, Mn, Fe, Ni, Cu,or Zn] At Temperatures Over 1000° C.," Journal of Solid State Chemistry, 1985, vol. 60, pp. 382-384.

Kimizuka, N. et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World'S Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors,"0 Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors using Amorphous oxide semiconductors," Nature, Nov. 25, 2004, vol. 432, pp. 488-492.

Nomura, K et al., "Carrier transparent oxide semicondoctor with intrinsic structural randomness probed single-crystalline InGaO3(ZnO)5 films," Appl. Physics Letters) , Sep. 13, 2004, vol. 85, No. 11, pp. 1993-1995.

Nowatari, H et al., "60.2: Intermediate Connector with Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 in. QVGA AMOLED Display Using In-Ga-Zn-Oxide TFTs With a Novel Passivation Layer," SID Digest '09 : SID International Symposium Digest of Technical Papers, May 31, 2009, pp. 284-287.

Ohara, H et al., "Amorphous In-Ga-Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In-Ga-Zn-Oxide TFT," SID Digest '09 : SID International Symposium Digest of Technical Papers, May 31, 2009, pp. 184-187.

Osada, T et al., "Development of Driver-Integrated Panel Using Amorphous In-Ga-Zn-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous.In-Ga-Zn-Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3-In2O3-ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 with Sputtered Al2O3 Gate Insulator," Appl. Phys. Lett. (Applied Physics Letters), Sep. 1, 203, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

\* cited by examiner

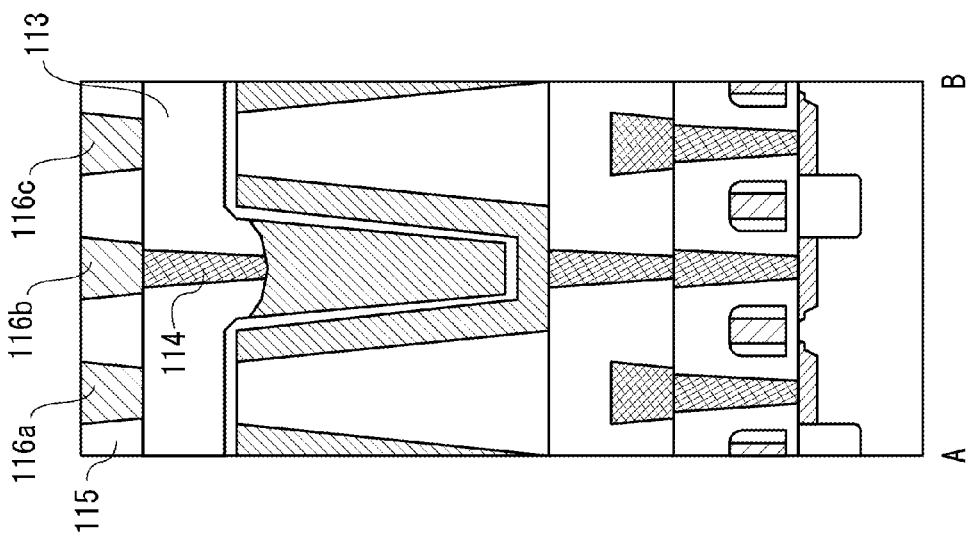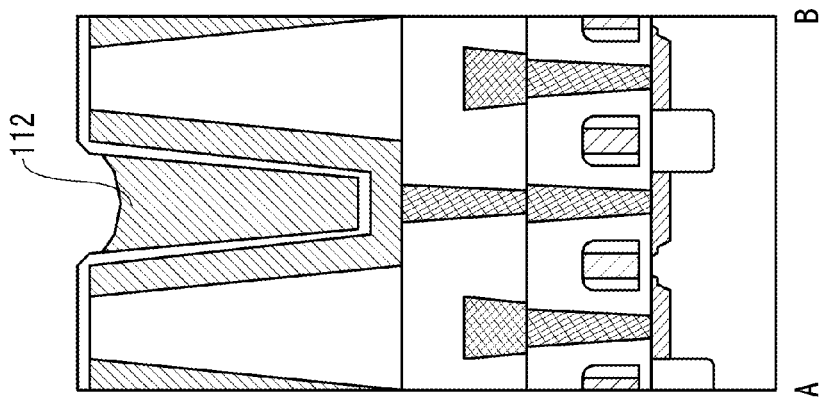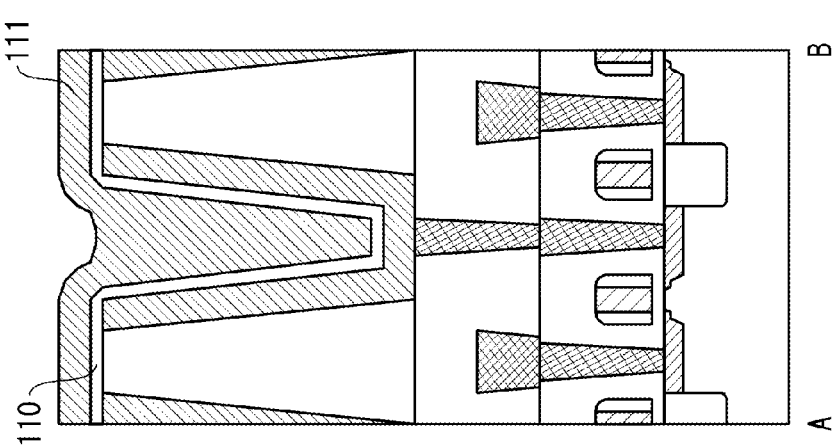

CAPACITOR AND SEMICONDUCTOR DEVICE INCLUDING DIELECTRIC AND N-TYPE SEMICONDUCTOR

BACKGROUND OF THE INVENTION

1. Field of the Invention

The present invention relates to capacitors used for semiconductor devices and semiconductor devices using the capacitors.

2. Description of the Related Art

Capacitors used for semiconductor integrated circuits and the like have conventional structures in each of which a dielectric such as silicon oxide is sandwiched between electrodes made of a metal or a semiconductor such as silicon with high conductivity. However, as circuits are miniaturized, the use of materials having higher permittivity (high-k materials) than silicon oxide (relative permittivity around 4) has begun to be studied.

A problem in the use of such a high-k material is generally that the electron affinity (the energy difference between a vacuum level and a bottom of a conduction band) of such a high-k material is large. For example, according to Reference 6, the electron affinity of silicon oxide is 0.9 eV, while the electron affinity of hafnium oxide that is one of high-k materials is 2.5 eV.

For that reason, for example, the potential barrier of a junction between n-type silicon and silicon oxide is 3.5 eV, whereas the potential barrier of a junction between n-type silicon and hafnium oxide is 1.5 eV (note that the potential barrier is not necessarily equal to the difference between the work function of n-type silicon and the electron affinity of a dielectric, due to polarization in the junction).

Even with the potential barrier of about 1.5 eV, if the thickness of a dielectric is 5 nm or more, a noticeable problem does not occur in an insulating property, but when the thickness of a dielectric is desirably 3 nm or less along with miniaturization of a circuit, the amount of a tunnel current due to a quantum effect becomes large, so that sufficient function as a capacitor is not met, which is a problem.

In addition, tantalum oxide, barium strontium titanate, lead titanate, lead zirconate, barium zirconate, or the like having a higher permittivity has a potential barrier of 0.5 eV or lower in a junction with n-type silicon, and thus a sufficient insulating property is difficult to be obtained even when the thickness of a dielectric is 10 nm or more.

In general, when the potential barrier is 1 eV or more, thermal excitation can be neglected. As long as a dielectric has an appropriate thickness, the dielectric can be practically used as a capacitor (see Reference 6). On the contrary, when the potential barrier is less than 1 eV, the dielectric is not suitable for a capacitor.

Such problems are thought to be solved by the use of a material having a higher work function than n-type silicon (its work function is 4.0 eV), that is, a metal such as gold (its work function is 5.1 eV), palladium (its work function is 5.2 eV), platinum (its work function is 5.4 eV). In other words, this is because the potential barrier of a dielectric, between the dielectric and a metal having a work function higher than that of n-type silicon by 1 eV, is higher by 1 eV than that of n-type silicon.

However, such metals having a high work function are expensive, and there is no other practical method for forming a thin film of such a metal, except a physical formation method such as a sputtering method. By a physical formation method, for example, it is difficult to form a film with a good coverage, over an object having a peculiar shape such as a trench-type capacitor or a stack-type capacitor used in DRAM or the like.

Also, there is a report that such a metal having a high work function is easily reacted with a high-k material. Further, for example, because platinum promotes oxygen release from an oxide, there is a need that a barrier layer of another material is formed separately between platinum and a high-k material.

REFERENCE

[Reference 1] U.S. Pat. No. 5,764,562
[Reference 2] U.S. Pat. No. 5,877,522
[Reference 3] U.S. Pat. No. 5,802,000
[Reference 4] U.S. Pat. No. 7,772,053
[Reference 5] United States Published Patent Application No. 2011/0227074
[Reference 6] John Robertson, "*Band offsets of wide-band-gap oxides and implications for future electronic devices*" Journal of Vacuum Science and Technology B, 18 p. 1785 (2000)
[Reference 7] R. E. Jones et al., "*Evidence for p-Type Doping of InN*", Phys. Rev. Lett. 96, p. 125505 (2006)
[Reference 8] M. Nakamura et al., "*The Phase Relations in the $In_2O_3$—$Ga_2ZnO_4$—$ZnO$ System at 1350° C.*", J. Solid State Chem., Vol. 93, pp. 298-315 (1991)

SUMMARY OF THE INVENTION

It is an object of one embodiment of the prevent invention to provide a capacitor using a high-k material, at a low cost. Further, it is another of one embodiment of the prevent invention to provide a capacitor using a high-k material that is formed over a surface having a peculiar shape with good coverage. Furthermore, it is another of one embodiment of the prevent invention to provide a capacitor suitable for highly miniaturization.

In addition, it is another object of one embodiment of the prevent invention to provide a semiconductor device having a capacitor. Moreover, it is another object of one embodiment of the prevent invention to provide a manufacturing method of the capacitor or a manufacturing method of the semiconductor devices. The present invention can achieve at least one of the above-described objects.

One embodiment of the present invention is a capacitor including an n-type semiconductor, wherein the n-type semiconductor is provided in contact with one surface of a dielectric, and includes nitrogen and at least one of indium, tin, and zinc, and has a work function of 5.0 eV or higher. Another embodiment of the present invention is a semiconductor device including: an n-type semiconductor that is provided in contact with one surface of a dielectric, includes nitrogen and at least one of indium, tin, and zinc, and has a work function of 5.0 eV or higher; and a conductive material that is provided on another surface of the dielectric so as to be opposite to the n-type semiconductor. Another embodiment of the present invention is a semiconductor device including a film of an n-type semiconductor that is provided on a side surface of an insulator, includes nitrogen and at least one of indium, tin, and zinc, and has a work function of 5.0 eV or higher; and a film of a dielectric formed over the film of the n-type semiconductor.

In any of the embodiments, the dielectric may include at least one material selected from the group consisting of strontium titanate, lead titanate, barium strontium titanate, lead zirconate, barium zirconate, tantalum oxide, strontium bismuth titanate, titanium oxide, zirconium oxide, hafnium oxide, aluminum oxide, yttrium oxide, lanthanum oxide, zirconium silicate, and hafnium silicate.

In any of the embodiments, the dielectric may be an oxide of at least one metal selected from the group consisting of strontium, titanium, barium, zirconium, lead, tantalum, bismuth, hafnium, aluminum, yttrium, and lanthanum, which is included at 50% or higher of the metal element(s) constituting the dielectric.

In any of the embodiments, the dielectric may include at least one material selected from the group consisting of indium oxide, zinc oxide, indium gallium oxide, indium zinc oxide, and indium gallium zinc oxide. Alternatively, in the dielectric, the percentage of any metal element of indium, zinc, and gallium among the metal element(s) is 20% or more.

Indium oxide, zinc oxide, and the like are known as oxide semiconductors having a band gap of 2.5 eV or higher, and a material having an electron affinity of 4.6 eV or lower of such oxide semiconductors has a potential barrier of 1 eV or higher with an n-type semiconductor in one embodiment of the present invention. Since such a material has a large band gap, it has few thermally excited carriers to be intrinsic and thus has high resistance.

In addition, even if such an oxide semiconductor has a large amount of donors, due to the contact with an n-type semiconductor in one embodiment of the present invention, electrons generated by the donors are absorbed into the n-type semiconductor and thus the oxide semiconductor is depleted to have extremely high resistance. Some of elements included in the n-type semiconductor in one embodiment of the present invention are also elements included in such oxide semiconductors, which can lead to simplification of a manufacturing process.

Similarly, gallium nitride, gallium aluminum nitride, or the like can be used as a dielectric.

A metal element in this specification refers to all elements other than a rare gas element, hydrogen, boron, carbon, nitrogen, Group 16 elements (e.g., oxygen), Group 17 elements (e.g., fluorine), silicon, phosphorus, germanium, arsenic, and antimony. In addition, the term "oxide" means a compound the percentage of oxygen of which is 50 at. % or higher in elements other than a metal element included in the compound.

In any of the embodiments, the work function of the n-type semiconductor is preferably 5.5 eV or higher. In addition, in any of the embodiments, the thickness of the n-type semiconductor is preferably from 4 nm to 10 nm. In any of the embodiments, the n-type semiconductor is preferably formed by an atomic layer deposition (ALD) method.

The capacitor or the semiconductor device described above can be used in a dynamic random access memory (DRAM). In addition, the capacitor or the semiconductor device described above can be used in a semiconductor integrated circuit. Further, the capacitor or the semiconductor device described above can partially or entirely constitute a trench-type capacitor or a stack-type capacitor.

Here, an n-type semiconductor with a high work function, which includes nitrogen and at least one of indium, tin, and zinc (hereinafter, also referred to as high-work-function compound semiconductor) preferably includes nitrogen at a concentration of from 5 at. % to 50 at. %. In addition, the high-work-function compound semiconductor preferably includes zinc at a concentration of from 5 at. % to 66.7 at. %. Alternatively, the high-work-function compound semiconductor preferably includes indium at a concentration of from 5 at. % to 50 at. %. Alternatively, the high-work-function compound semiconductor preferably includes tin at a concentration of from 5 at. % to 57.1 at. %.

The high-work-function compound semiconductor may contain a metal element with an atomic number of 20 or less at a concentration of 1% or less, preferably 0.01% or less. The high-work-function compound semiconductor may contain oxygen or another metal element with an atomic number of 21 or more. The high-work-function compound semiconductor may contain hydrogen at a concentration of 0.01 at. % to 10 at. %. The percentage of oxygen contained in the high-work-function compound semiconductor may be 20 at. % to 90 at. % of the element(s) (including oxygen) other than the metal element.

Indium nitride with a chemical formula InN is given as an example of the high-work-function compound semiconductor. Indium nitride is a semiconductor with a band gap of 0.7 eV or less and an electron affinity of 5.6 eV. It is known that indium nitride has a wurtzite type structure.

It is known that part of indium in indium nitride substituted with gallium or aluminum, thereby the band gap can be increased and its degree depends on the proportion of the substituted part or the substituted element. In a similar manner, the electron affinity can be changed in accordance with the proportion of the substituted part or the substituted element.

For example, the electron affinity of a substance represented by a composition formula of $In_{0.9}Ga_{0.1}N$ is approximately 5.4 eV. In general, the electron affinity of a substance represented by a composition formula of $In_{1-a}Ga_aN$ is approximately $(5.6-2a)$ [eV] (where $a \leq 0.3$).

Zinc nitride known as having a chemical formula of $Zn_3N_2$ is given as another example. The details of the physical values of zinc nitride have not been known; however, it has an electron affinity of approximately 5.5 eV. It is known that zinc nitride has a cubic crystal structure.

Such a high-work-function compound semiconductor may be formed by a known method such as a sputtering method, a vacuum evaporation method, an ion plating method, an MBE (molecular beam epitaxy) method, or a CVD method (an MOCVD (metal organic CVD) method or an ALD method).

For example, when a film of gallium indium nitride ($In_{1-a}Ga_aN$) is formed by an MOCVD method, trimethylindium (($CH_3)_3In$), trimethylgallium (($CH_3)_3Ga$), and ammonia may be used as a source gas and the substrate temperature may be set to 350° C. to 550° C.

In addition, when a thin film of such a high-work-function compound semiconductor is formed to a thickness of 10 nm or less, or when such a film is formed in a hole with an aspect ratio exceeding 50, it is effective to employ an ALD method, in which an atomic layer is deposited one layer by one layer with use of a material gas or the like described above.

The work function of the above high-work-function compound semiconductor is 5.0 eV or higher. Therefore, many of defect levels formed at levels which are 4 eV to 5 eV below the vacuum level (typically, the level which is 4.9 eV below the vacuum level, see Reference 7) serve as donors, and an n-type semiconductor having an electron concentration of $1 \times 10^{19}$ $cm^{-3}$ or more, preferably $1 \times 10^{20}$ $cm^{-3}$ or more is provided without particular doping treatment.

Since the work function is higher than n-type silicon by 1.0 eV or more as described above, the potential barrier in junction with a dielectric is higher than n-type silicon by 1.0 eV or more. Further, such a high-work-function compound semiconductor can be synthesized without using a precious metal. In addition, it is possible that an extremely thin film of such a high-work-function compound semiconductor is deposited uniformly and a thin film of such a high-work-function compound semiconductor is formed over a surface having a peculiar shape.

It is most effective to use such a high-work-function compound semiconductors for both electrodes of a capacitor; however, for some reasons, even when such a high-work-function compound semiconductor is used for only one electrode of a capacitor and a material having a lower work function is used for the other electrode of the capacitor, a sufficient effect can be obtained. In that case, in order to obtain a sufficient insulating property, the potential of an electrode using such a high-work-function compound semiconductor (electrode A) is preferably equal to or lower than that of the other electrode (electrode B).

For example, the work function of the electrode A is 5.5 eV, the work function of the electrode B is 4 eV, and the dielectric is tantalum oxide (its electron affinity is 3.2 eV). According to Reference 6, the potential barrier in the junction between the electrode B and the dielectric is 0.36 eV. Similarly, the potential barrier in the junction between the electrode A and the dielectric is 1.86 eV.

When the potential of the electrode A is lower than that of the electrode B, electrons are thought to move from the electrode A to the electrode B. However, since the potential barrier in the junction between the electrode A and the dielectric is as high as 1.86 eV, the tunneling probability is extremely low.

On the contrary, when the potential of the electrode A is higher than that of the electrode B, electrons are thought to move from the electrode B to the electrode A. In that case, the potential barrier in the junction between the electrode B and the dielectric is as low as 0.36 eV. Further, when the potential of the electrode A is higher than that of the electrode B by 1.5 V or more, electrons can move from the electrode B to the electrode A by surmounting the potential barrier with height corresponding to 1.5 V or higher. For that reason, when the potential of the electrode A is higher than that of the electrode B by 1.5 V or more, the tunneling probability is rapidly increased. Therefore, as for the capacitor having such electrodes described above, polarities or a potential difference should be considered.

Most of high-k materials are oxides, and thus when oxygen is contained in the elements other than a metal element, among the elements constituting a high-work-function compound semiconductor, at 20 at. % to 90 at. %, the adhesiveness with the high-k material is favorable. In addition, an oxidation-reduction reaction hardly occurs at the interface, and thus the interface is stable chemically.

In particular, the bonding strength between oxygen and an indium element, among elements constituting high-work-function compound semiconductors, is equal to or weaker than the bonding strength between oxygen and an atom of a metal that is often used in a high-k material (examples of such metals are strontium, titanium, barium, zirconium, tantalum, bismuth, lead, hafnium, aluminum, yttrium, and lanthanum); therefore, oxygen is not extracted from the high-k material, which is effective to stabilize the high-k material.

BRIEF DESCRIPTION OF THE DRAWINGS

In the accompanying drawings:

FIGS. 2A to 2C are cross-sectional views illustrating an example of a manufacturing method of a semiconductor device of the present invention;

DETAILED DESCRIPTION OF THE INVENTION

Figure 1A:
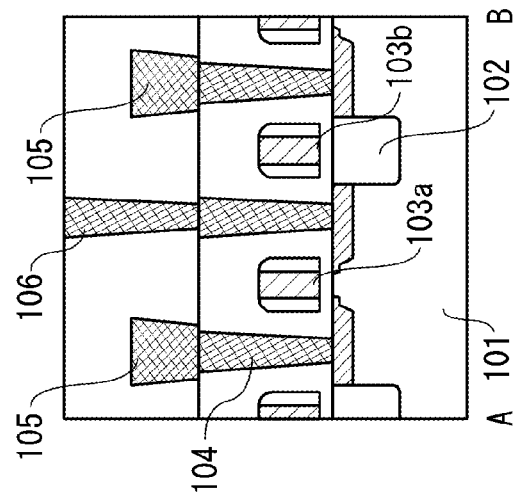
FIGS. 1A to 1C are cross-sectional views illustrating an example of a manufacturing method of a semiconductor device of the present invention.
Figure 1B:
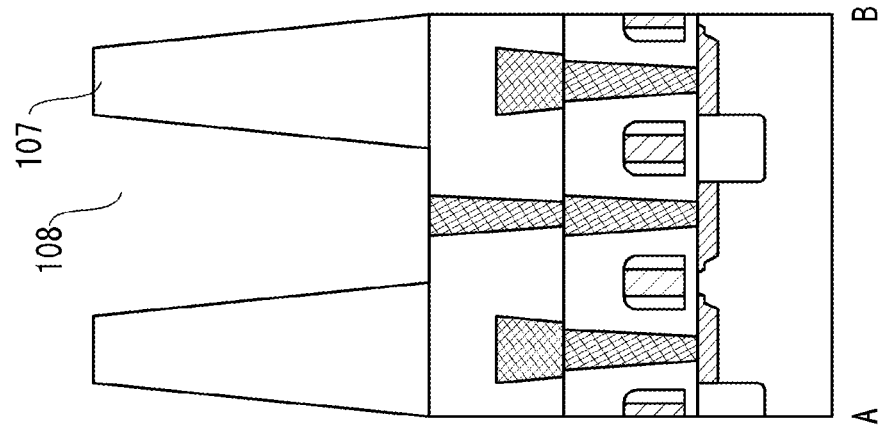
Figure 1C:
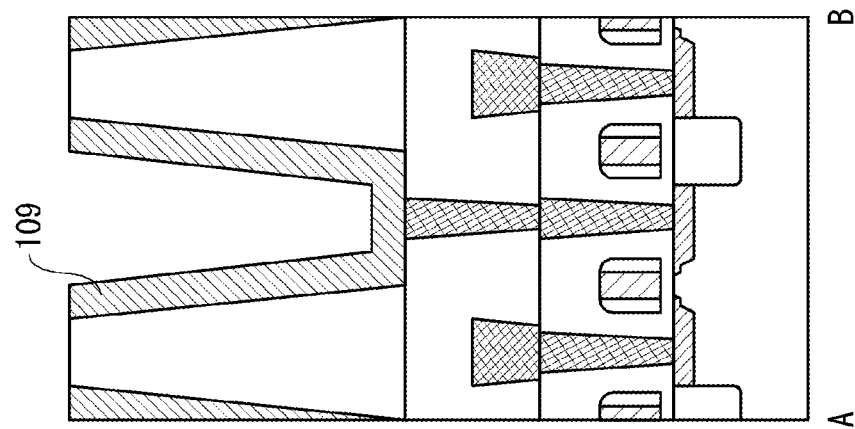
Figure 3C:
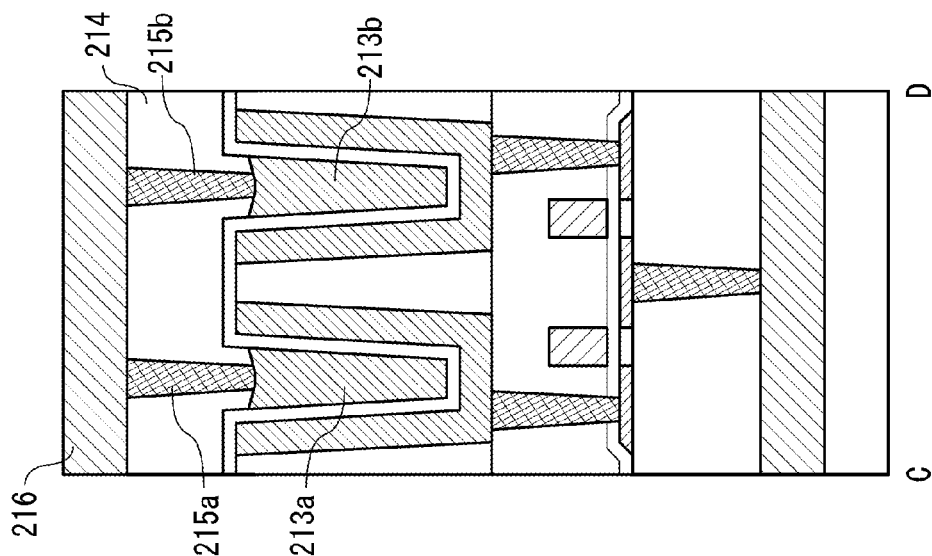
FIGS. 3A to 3C are cross-sectional views illustrating an example of a manufacturing method of a semiconductor device of the present invention.
Figure 3B:
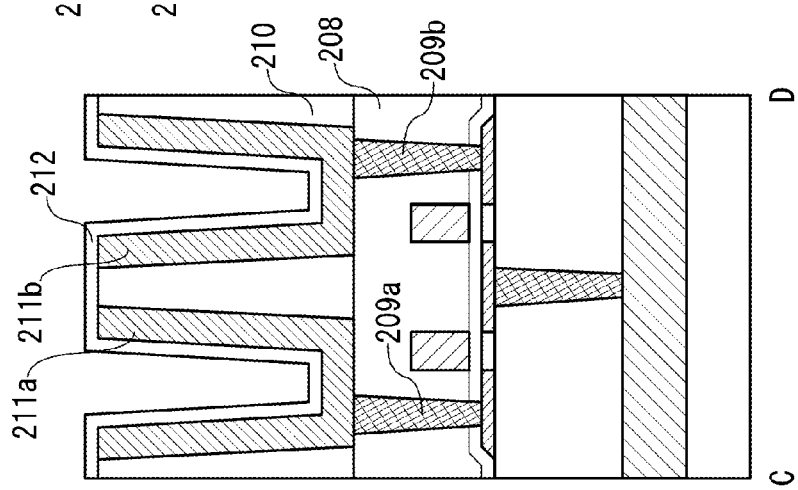
Figure 3A:
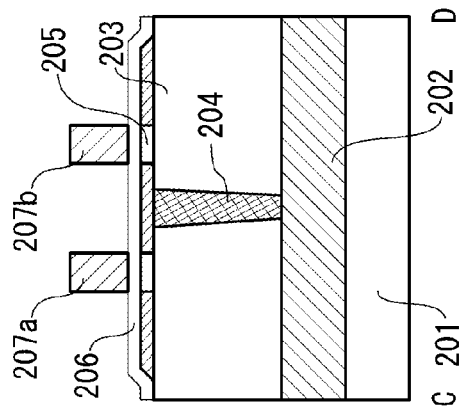

Hereinafter, embodiments will be described with reference to the drawings. However, the embodiments can be implemented in various modes. It will be readily appreciated by those skilled in the art that modes and details can be changed in various ways without departing from the spirit and scope of the present invention. Thus, the present invention should not be interpreted as being limited to the following description of the embodiments.

Embodiment 1

In FIG. 1A to FIG. 1C, FIG. 2A to FIG. 2C, and FIG. 4A to FIG. 4D, an example of a manufacturing process of a semiconductor device (a DRAM having a stack-type capacitor) in this embodiment is illustrated. Note that unless otherwise specified, for materials used, methods, and the like, those of known manufacturing techniques of semiconductor integrated circuits may be referred to.

FIG. 1A to FIG. 1C and FIG. 2A to FIG. 2C are cross-sectional views of a manufacturing process of a semiconductor device in this embodiment, and FIG. 4A to FIG. 4D are schematic top views of the manufacturing process of the semiconductor device in this embodiment. In FIG. 4A to FIG. 4D, only major wirings and the like are illustrated. The cross-sections taken along the dashed-dotted line A-B in FIG. 4A to FIG. 4D correspond to the cross-sectional views of FIG. 1A to FIG. 1C and FIG. 2A to FIG. 2C.

In this embodiment, manufacturing of a so-called folded-bit-line DRAM is described. In such a folded bit line system, the area of a memory cell is 8 $F^2$ (F is a feature size) as a minimum value. When F is 20 nm or less, there will be a physical limit for DRAMs. In a DRAM, the capacitance of a capacitor is desired to be constantly 10% or more of a parasitic capacitance of a bit line. In other words, even if a design rule is smaller, the capacitance of a capacitor should be constant when the length of a bit line is not changed.

When the feature size F is 20 nm or less, a stack-type capacitor or a trench-type capacitor is formed in a hole having one side of 20 nm to 40 nm, irrespective of the capacitor type. The stack-type capacitor includes two electrodes inside and outside and a dielectric, and when the electrode is thin, electric resistance becomes high unfortunately. On the other hand, when the thickness of the dielectric (assuming that there is a potential barrier of 2 eV or higher between the electrodes and the dielectric in this case) is less than 2 nm, tunneling current flows, which decreases storage of charges unfortunately.

In general, the thickness t of the dielectric need be 2 nm or more and (F-4 [nm]) or less. Thus, when the feature size F is 20 nm, t is from 2 nm to 16 nm, and when the feature size F is 10 nm, t is from 2 nm to 6 nm. The dielectric is preferably as thin as possible, and thus when the feature size F is from 10 nm to 20 nm, the thickness t is preferably from 4 nm to 6 nm.

On the other hand, according to the above conditions, when the feature size F is less than 6 nm, the thickness t is less than 2 nm, and thus a capacitor cannot be formed practically.

In addition, in order to obtain a constant capacitance with use of a hole with a limited cross-sectional area, either to deepen the hole or to form a dielectric of a high-k material is employed. In deepening the hole, it is technically difficult to form a hole with an aspect ratio of 200 or more. For that reason, it has been mainly considered to form a dielectric of a high-k material.

However, it is very difficult to form a capacitor using a high-k material in a hole with an aspect ratio of 50 to 200. It is possible to form a sufficiently thin film inside such a hole, with use of any of many conductive materials used for semiconductor integrated circuits; however, such a conductive material does not have a high work function, and thus a sufficient potential barrier is not formed between a high-k material and such a conductive material. Thus, the thickness of a dielectric is needed to be 10 nm or more, and from the above relation, such a conductive material cannot be used when F is less than 14 nm.

On the other hand, because platinum group elements have high work function, they can form a sufficient potential barrier with a high-k material. However, since platinum group elements are seldom used for semiconductor integrated circuits, a technique is not known, with which a thin film of such a platinum group element is formed evenly inside such a hole.

However, as for high-work-function compound semiconductors, because indium is an element used for compound semiconductors such as indium arsenide, for example, a film of indium nitride can be formed evenly to a desired thickness inside such a hole by improving an existing manufacturing technique of semiconductor integrated circuits. Hereinafter, description is given with reference to drawings.

[FIG. 1A]

By a known manufacturing technique of semiconductor integrated circuits, over a substrate 101 of a single crystal silicon or the like, a first insulator 102, word lines 103a and 103b, a first contact plug 104, a bit line 105, and a second contact plug 106 are formed. The first insulator serves as an element separation insulator.

Figure 4A:
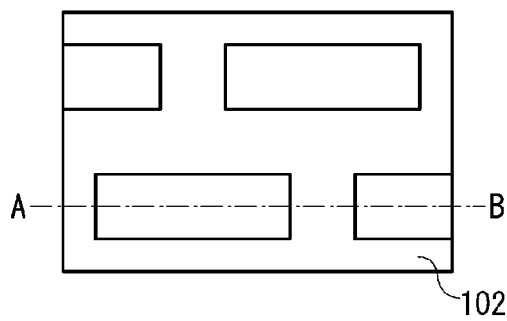
FIGS. 4A to 4F are top views each illustrating an example of the manufacturing method of a semiconductor device of the present invention.
Figure 4B:
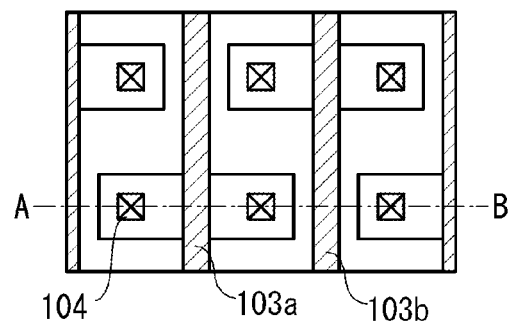
Figure 4C:
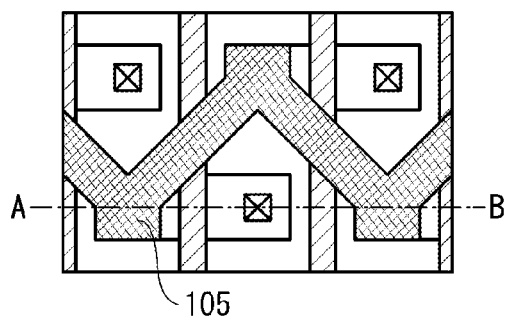

For these steps, FIG. 4A to FIG. 4C can also be referred to. In other words, over the substrate 101, the first insulator 102 (element separation insulator) is formed, and a plurality of rectangular regions for forming transistors are formed in a staggered manner (FIG. 4A). Next, the plurality of word lines 103a and 103b are formed so as to cross over centers of the rectangular regions. In addition, in each rectangular region, two first contact plugs 104 are provided (FIG. 4B). Further, a bit line 105 is formed in a zigzag manner so as to connect one of the first contact plugs 104 in one rectangular region to one of the first contact plugs 104 in another rectangular region (FIG. 4C). A capacitor is formed later in the other first contact plug 104 in each rectangular region.

[FIG. 1B]

A second insulator 107 of silicon oxide is formed, and a hole 108 where a capacitor is to be formed is provided in the second insulator 107. Note that a silicon oxynitride (oxygen/nitrogen=0.2 to 0.8) film with a thickness of from 2 nm to 5 nm is formed inside the hole 108 and thus an adhesiveness with a first high-work-function compound semiconductor layer 109 described later can be increased.

[FIG. 1C]

Inside the hole 108, the first high-work-function compound semiconductor layer 109 with a thickness of from 2 nm to 5 nm is formed. It is not preferable that the thickness of the first high-work-function compound semiconductor layer 109 is less than 2 nm, because the conductivity is not sufficient. In addition, the upper limit on the thickness of the first high-work-function compound semiconductor layer 109 may be determined depending on the feature size F. For example, preferably, when F is 20 nm, the thickness is 5 nm or less, and when F is 10 nm, the thickness is 2.5 nm or less.

In this embodiment, as the high-work-function compound semiconductor, oxynitride indium is used to increase the adhesiveness. The ratio of oxygen to nitrogen (oxygen/nitrogen) among the elements constituting oxynitride indium may be 0.2 to 0.8. Alternatively, if an insulating film with a high nitrogen concentration is formed inside the hole 108, indium nitride may be used.

Note that the resistivity of the high-work-function compound semiconductor is $1\times10^{-2}$ Ωcm or less, preferably $1\times10^{-4}$ Ωcm or less. In particular, not only indium oxynitride, but many high-work-function compound semiconductors contain hydrogen at 1 at. % to 10 at. % and thus carriers are increased to enhance the conductivity, which is preferable.

[FIG. 2A]

A third insulator 110 with a thickness of 2 nm to 5 nm is formed. As the third insulator 110, a variety of high-k materials can be used, and in particular, hafnium oxide, zirconium oxide, tantalum oxide, or the like is preferable. Further, a second high-work-function compound semiconductor layer 111 is formed using indium oxynitride again. At this time, preferably, the second high-work-function compound semiconductor layer 111 is formed so that the hole 108 is filled with the indium oxynitride.

[FIG. 2B]

The second high-work-function compound semiconductor layer 111 is etched to expose the third insulator 110 in portions other than the hole 108 and an counter electrode 112 is formed. These steps are performed in order to prevent short-circuiting between electrodes in the vicinity of the opened side of the hole 108.

[FIG. 2C]

Figure 4D:
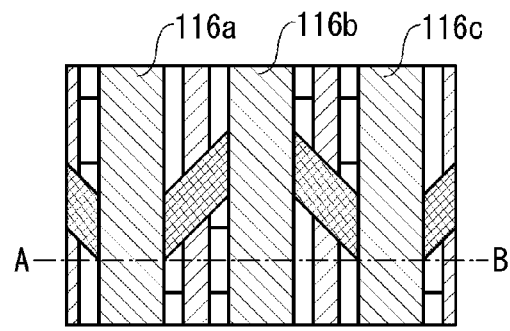

After that, a fourth insulator 113 and a third contact plug 114 are formed, then a fifth insulator 115 is formed, and capacitor lines 116a, 116b, and 116c are formed. In this embodiment, as illustrated in FIG. 4D, the capacitor lines 116a, 116b, and 116c are formed parallel to the word lines 103a and 103b. However, the capacitor lines may be formed parallel to the bit line 105.

In this manner, a memory cell of a folded-bit-line DRAM can be formed. Note that the potentials of the capacitor lines 116a, 116b, and 116c can be controlled separately, but the capacitor lines 116a, 116b, and 116c may be common potential lines to which the same potential is constantly given.

Embodiment 2

This embodiment is illustrated in FIG. 3A to FIG. 3C and FIG. 4E and FIG. 4F. In this embodiment, an open-bit-line DRAM is manufactured using a thin film transistor. The area of a memory cell of an open-bit-line DRAM can be downsized to 6 $F^2$ (F is a feature size) ideally, which is smaller than that of the folded-bit-line DRAM described in Embodiment 1. Hereinafter, description is given with reference to the drawings.

[FIG. 3A]

A bit line 202 is formed over a first insulator 201. Further, a second insulator 203 is formed, and a first contact plug 204 connected to the bit line 202 is formed in the second insulator 203. Further, a semiconductor layer 205 with an appropriate thickness and size, a third insulator 206 covering the semiconductor layer 205, and word lines 207a and 207b are formed. The third insulator 206 serves also as a gate insulating film of a thin film transistor.

There are no particular limitations on the semiconductor layer 205, and single crystal, polycrystal, or amorphous may be used, and elements belonging to Group 14, such as silicon or germanium, or a compound such as gallium arsenide, indium oxide, zinc sulfide, or gallium nitride may be used. In addition, the semiconductor layer may contain an additive, without being limited to pure substances. In addition, the semiconductor layer 205 may have an n-type region, a p-type region, an intrinsic region, or a region having an intermediate conductivity between the intrinsic region and the n-type or p-type region as necessary.

Figure 4E:
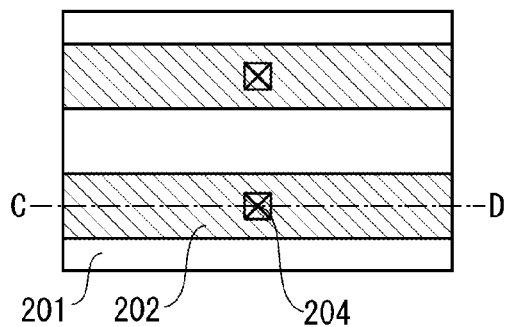
Figure 4F:
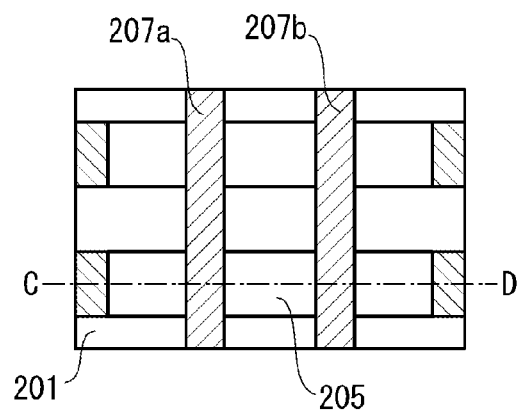
Figure 5A:
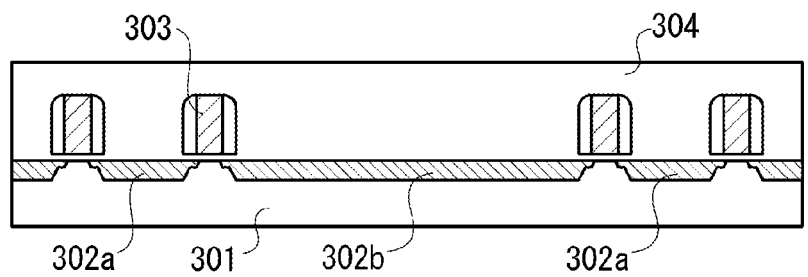
FIGS. 5A to 5E are cross-sectional views illustrating an example of a manufacturing method of a semiconductor device of the present invention.
Figure 5B:
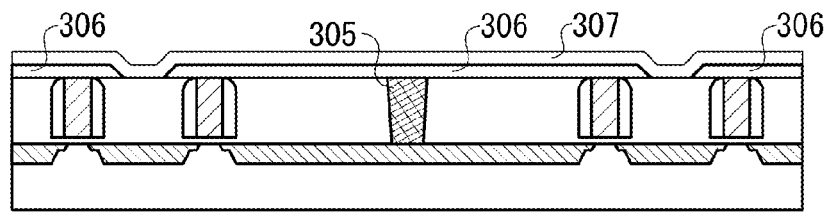
Figure 5C:
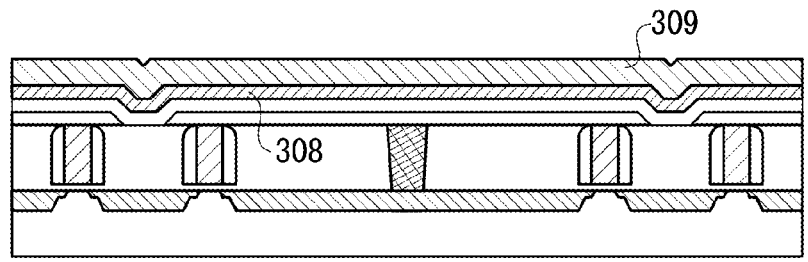
Figure 5D:
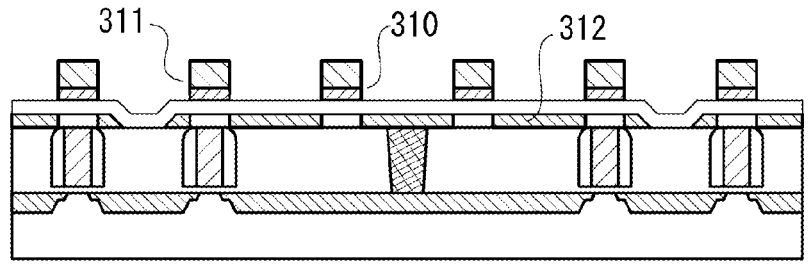
Figure 5E:
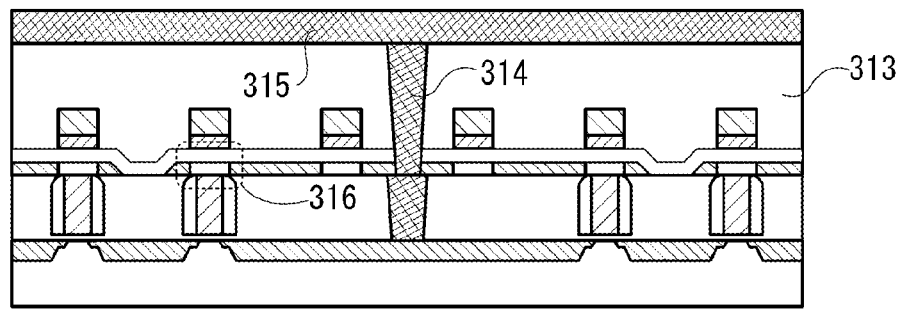

For the above-described steps, FIG. 4E and FIG. 4F can also be referred to. In other words, the bit line 202 is formed over the first insulator 201, and the first contact plug 204 connected to the bit line 202 is formed (FIG. 4E). Further, the semiconductor layer 205 is formed to overlap with the bit line 202. In addition, the word lines 207a and 207b are formed (FIG. 4F).

In general, below the first insulator 201, a semiconductor integrated circuit is often provided. In such cases, noise generated by such a semiconductor integrated circuit may interfere with operation of a thin film transistor formed in an upper layer. In order to solve the problem, a shield layer may be provided below the thin film transistor to absorb noise; however, as illustrated in FIG. 4F, the bit line 202 and the semiconductor layer 205 are arranged so as to overlap with each other, so that the bit line 202 serves as a shield layer and absorbs noise.

[FIG. 3B]

A fourth insulator 208 is formed, and second contact plugs 209a and 209b are formed. A fifth insulator 210 having a hole where a capacitor is formed is formed, and high-work-function compound semiconductor layers 211a and 211b and a sixth insulator 212 covering them are formed. A high-k material may be used as the sixth insulator 212. For the formation methods of the high-work-function compound semiconductor layers 211a and 211b and the sixth insulator 212, Embodiment 1 can be referred to.

[FIG. 3C]

After counter electrodes 213a and 213b are formed, a seventh insulator 214, third contact plugs 215a and 215b connected to the counter electrodes 213a and 213b, and a capacitor line 216 are formed. In this manner, a memory cell of the open-bit-line DRAM can be formed.

In this embodiment, the capacitor line 216 is arranged parallel to the bit line 202. The same potential may be constantly given to the capacitor line 216, but a potential synchronized with the bit line 202 may be given to the capacitor line 216. For example, as described in Reference 1, a complementary potential, which has a phase opposite to that of the bit line, may be given.

In the memory cell of the open-bit-line DRAM in this embodiment, the bit line 202 is arranged below the transistor, and thus the memory cell of the open-bit-line DRAM has high freedom of design, although having a stack-type capacitor. An open-bit-line DRAM having a stack-type capacitor is described in, for example, Reference 2 or 3; however, in Reference 2, an auxiliary wiring is needed to connect a transistor to a bit line, and in Reference 3, a bit line is needed to intersect with a word line at a non-right angle (as a result, a memory cell is needed to be a parallelogram).

In either case, an extra process and an excessive area are produced. This is because a bit line and a capacitor exist together above a transistor, and thus the bit line is desired to be arranged avoiding the capacitor. On the contrary, as in this embodiment, when the bit line is arranged below the transistor but the capacitor is arranged above the transistor, the bit line can be arranged irrespective of the position of the capacitor, which leads to an extremely effective layout.

Embodiment 3

This embodiment is illustrated in FIGS. 5A to 5E and FIGS. 6A and 6B. In this embodiment, a signal-amplification type memory cell (see Reference 4) using two transistors is formed.

Figure 6A:
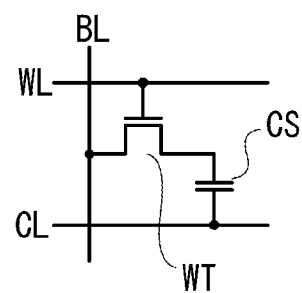
FIGS. 6A and 6B are diagrams each illustrating a circuit of a semiconductor device of the present invention.

FIG. 6A is a circuit diagram of a memory cell of a normal DRAM having one transistor and one capacitor (also referred to as 1T1C DRAM) described in Embodiment 1 or Embodiment 2. In the DRAM, a writing transistor WT is turned on or off in response to a potential of a word line WL, and a charge is transferred between the bit line BL and a capacitor CS. Thus, in accordance with a parasitic capacitance of the bit line BL, the capacitance of the capacitor CS should be determined, and even if the design rule is smaller, a nearly equal capacitance is needed. For that reason, it is necessary to employ a trench-type capacitor or a stack-type capacitor, or further a high-k material.

Figure 6B:
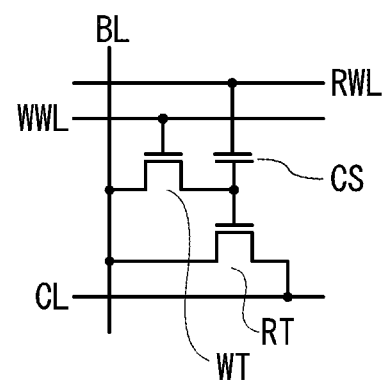

On the contrary, a memory cell illustrated in FIG. 6B has two transistors and one capacitor. Charges stored in the cell are amplified by a reading transistor RT, and thus the capacitance of the capacitor can be ideally smaller at the same speed as that of the reading transistor RT.

However, a state between a source and a drain of the writing transistor WT is a finite resistant state (generally, $1\times10^{13}\Omega$ to $1\times10^{14}\Omega$) even in an off state. The time required for charges in the capacitor to be lost is a product of the resistance and the capacitance of the capacitor CS. Therefore, when the capacitance of the capacitor CS is decreased, the loss of charges progresses at higher speed.

The capacitance of the capacitor in the memory cell of the 1T1C DRAM in FIG. 6A is about $1\times10^{-14}$ F, and thus the time required for charges to be lost is about 0.1 second. Therefore, in such a memory cell, charges should be reinjected (refreshed) several tens of times per second.

This can be similarly applied to the memory cell in FIG. 6B, and when the capacitance of the capacitor CS is about $1\times10^{-14}$ F, only several tens of times per second of refreshments are sufficient. However, if such a large capacitance is provided, an extra transistor is not needed. As long as an extra transistor is provided, the capacitance is preferably smaller.

However, if the capacitance becomes one tenth or further one hundredth, the time for charges to be lost is one tenth or further one hundredth as well; therefore, the time of refreshments is also several hundreds of times or several thousands of times per second, which are not suitable for practical use. In other words, the memory cell illustrated in FIG. 6B is not suitable for practical use, when the resistance in an off state of the transistor is $1\times10^{-15}\Omega$ or lower.

In order to form a practical memory cell with use of the circuit illustrated in FIG. 6B, the resistance in an off state of the writing transistor WT should be $1\times10^{18}\Omega$ or more, preferably $1\times10^{21}\Omega$ or more. For example, in a case where the capacitance of the capacitor CS is made to be $1\times10^{-17}$ F, which is one thousandth of that of a normal DRAM, when the resistance in an off state of the writing transistor WT is $1\times10^{18}\Omega$, refreshment may be conducted at several times per second and when the off resistance is $1\times10^{21}\Omega$, refreshment may be conducted once every several minutes. Thus, power consumption can be reduced with compared with normal DRAMs. If the off resistance is higher, the frequency of refreshment can be further reduced.

In order to obtain such an extremely high off resistance, it is necessary to use extremely thin silicon (see Reference 4) or a wide band gap semiconductor having a band gap of from 2.5 eV to 4 eV, preferably from 3 eV to 3.8 eV (see Reference 5). As the latter, for example, oxide semiconductor such as indium oxide or zinc oxide, nitride semiconductor such as gallium nitride, or sulfide semiconductor such as zinc sulfide may be used.

The off resistance is proportional to the concentration of thermally excited carries. Even in a state that no carriers such as donors or acceptors exist (intrinsic semiconductor), the band gap of a bulk silicon is 1.1 eV, and thus the concentration of thermally excited carriers at room temperature (300 K) is about $1 \times 10^{11}$ cm$^{-3}$.

According to Reference 4, it is reported that the concentration of thermally excited carriers of extremely thin silicon is smaller by about three digits than that of bulk silicon, because the band gap in the extremely thin silicon becomes larger due to quantum effect.

On the other hand, the concentration of thermally excited carriers of semiconductor having a band gap of 3.2 eV is about $1 \times 10^{-7}$ cm$^{-3}$. When the electron mobility is the same, the resistivity is inversely proportional to the carrier concentration, and thus the resistivity of the semiconductor having a band gap of 3.2 eV is higher by 18 digits than that of silicon.

Note that the concentration of carriers such as donors and acceptors is preferably as low as possible, and is preferably $1 \times 10^{12}$ cm$^{-3}$ or lower. Depending on the carrier concentration, the threshold of the transistor is determined.

As described above, when the circuit illustrated in FIG. 6B is used as a memory cell, kinds and properties of semiconductor used for the transistor are important. It is noted that the above description is made on the assumption that resistance of the dielectric of the capacitor has no limits, but in some cases there is a limit on the resistance depending on the thickness of the dielectric or the height of the potential barrier. As a result, if the parasitic capacitance of the capacitor is lower than the off resistance of the transistor, the refresh interval may be shorter than expected.

In order to increase the parasitic capacitance of the capacitor as much as possible, the substantial thickness of the dielectric may be 5 nm or more, preferably 10 nm or more, and the potential barrier may be 1.5 eV or more, preferably 2.5 eV or more. Hereinafter, description is given with reference to the drawings.

[FIG. 5A]

Over a substrate 301 of single crystal silicon or the like, conductive regions 302a and 302b, and a floating gate 303 are formed. The conductive region 302a serves as a wiring denoted by a common potential line CL in FIG. 6B, and is formed parallel to the writing word line WWL and the reading word line RWL. In addition, a first insulator 304 is formed.

[FIG. 5B]

The first insulator 304 is etched so that a surface of the floating gate 303 is exposed, and a contact hole is formed. In the contact hole, a first contact plug 305 is buried so as to be connected the conductive region 302b. Further, a semiconductor layer 306 having a thickness of from 2 nm to 10 nm, preferably 2 nm to 5 nm and an appropriate shape and area, and a second insulator 307 covering the semiconductor layer 306 are formed. A material used for the semiconductor layer 306 may be selected based on the conditions described above.

The second insulator 307 serves as a gate insulating film of a thin film transistor formed using the semiconductor layer 306 and further as a dielectric of a capacitor. The second insulator 307 is formed using a high-k material and has a thickness of from 2 nm to 10 nm, preferably 2 nm to 5 nm.

[FIG. 5C]

An oxynitride film with high work function (hereinafter referred to as a high-work-function oxynitride film 308) such as zinc oxynitride, indium oxynitride, tin oxynitride, indium-zinc oxynitride, or indium-zinc-gallium oxynitride (composition formula: $In_aGa_bZn_cO_dN_e$ ($0 \leq a \leq 1$, $0 \leq b \leq 1$, $0 \leq c \leq 1$, $0 \leq d \leq 1$, $0 \leq e \leq 1$)) is formed by a reactive sputtering method.

For example, in order to form a film of zinc oxynitride, a condition in which zinc oxide is a target and the nitrogen concentration is 50% or more and the oxygen concentration is 5% or less in an atmosphere may be employed. In a similar manner, in order to form a film of indium oxynitride, a condition in which tin oxynitride, indium-zinc oxynitride, or indium-zinc-gallium oxynitride, the nitrogen concentration is 50% or more and the oxygen concentration is 5% or less in the atmosphere, and indium oxide, tin oxide, indium-zinc oxide, or indium-zinc-gallium oxide is used as the target, respectively, may be employed.

In that case, the substrate temperature may be set in the range from 100° C. to 600° C., preferably 150° C. to 450° C. After the film formation, thermal treatment may be performed under a non-oxidization atmosphere at 100° C. to 600° C., preferably 150° C. to 450° C.

Note that an ALD method or a CVD method (such as an MOCVD method) may be employed, in addition to a sputtering method. In particular, in a case where the second insulator 307 has a thickness of 5 nm or less, the use of an ALD method or a CVD method which gives less damage on the second insulator 307 is preferable.

It is known that an example of indium-zinc-gallium oxide represented by the composition formula InGaZnO$_4$ has a crystal structure called YbFe$_2$O$_4$ structure (see Reference 8). However, for example, when 5 at. % or more of nitrogen is added, the wurtzite type structure becomes a stable phase; accordingly, the electron state drastically changes. Since the wurtzite structure is crystallized more easily than the YbFe$_2$O$_4$ structure, the crystallization is performed at relatively low temperature.

As for the electron state, for example, the YbFe$_2$O$_4$ structure has a band gap of approximately 3.2 eV, while the wurtzite structure has a band gap of 2.2 eV or less. As for the electron affinity, that of the former is approximately 4.3 eV, while that of the latter is 5.5 eV or more. Since the electron affinity is 4.9 eV or more, the n-type conductivity is exhibited due to the defect level. Since hydrogen functions as a donor, the carrier concentration can be increased by addition of hydrogen.

Preferably, besides nitrogen, zinc, tin, and indium, the high-work-function oxynitride film 308 contains oxygen 2 to 5 times as much as nitrogen because the generation of trap levels at the interface with the gate insulating film can be suppressed. Moreover, preferably, the high-work-function oxynitride film 308 contains hydrogen at 1 at. % to 10 at. % because the state of the interface is improved and the carriers are increased to improve the conductivity.

Note that instead of indium-zinc-gallium oxide (In—Ga—Zn—O), for example, a two-component metal oxide such as In—Sn—O, Sn—Zn—O, Al—Zn—O, or In—Ga—O, a three-component metal oxide such as In—Sn—Zn—O, In—Al—Zn—O, Sn—Ga—Zn—O, Al—Ga—Zn—O, or Sn—Al—Zn—O; or a four-component metal oxide such as In—Sn—Ga—Zn—O may be used. For example, In—Ga—Zn—O means an oxide containing indium (In), gallium (Ga), and zinc (Zn).

After that, a conductive film 309 formed of a metal film or a metal compound film with high conductivity is formed with an appropriate thickness. For the metal film, aluminum, titanium, tantalum, tungsten, or the like or an alloy containing any of these at 50% or more can be used. For the metal compound film, a nitride film containing any of these can be used.

[FIG. 5D]

The high-work-function oxynitride film 308 and the conductive film 309 are etched, and a writing word line 310 and a reading word line 311 including the stacked layer of the high-work-function oxynitride film 308 and the conductive film 309 are formed. In addition, with use of the writing word line 310 and the reading word line 311 as masks, the semiconductor layer 306 is irradiated with a rare gas element such as argon, and/or an element to be easily oxidized such as phosphorus, aluminum, or gallium so that oxygen deficiencies or the like are introduced to the semiconductor layer 306, and thereby, an n-type region 312 is formed. In a similar manner, the n-type region can be formed also by irradiation with nitrogen ions.

[FIG. 5E]

A third insulator 313, a second contact plug 314 connected to the first contact plug 305, and a bit line 315 are formed. The bit line 315 corresponds to the bit line BL in FIG. 6B and intersects with the writing word line WWL at right angles.

The thusly formed memory cell has an area of $8 F^2$ to $12 F^2$. In addition, in this memory cell, a capacitor 316 (corresponding to the capacitor CS in FIG. 6B) is formed between the floating gate 303 and the reading word line 311. Because the thin film transistor is an n-channel transistor, the potential on the capacitor side is preferably equal to or higher than the potential of the bit line to store charges.

Similarly, the potential of the reading word line 311 is preferably equal to or lower than the potential of the floating gate 303. As long as the condition is satisfied, there is no particular limitation on the work function of a material used for the floating gate 303, rather, when the work function is equal to or lower than the electron affinity of semiconductor included in the semiconductor layer, the resistance in the junction with the semiconductor layer 306 can be reduced, which is preferable.

When the potential of the reading word line 311 is lower than that of the floating gate 303 (that is, when positive charges are accumulated in the floating gate 303), the semiconductor layer 306 existing therebetween is depleted so as to be a dielectric. In this case, the dielectric of the capacitor 316 can be regarded as a stacked layer of the second insulator 307 and the semiconductor layer 306.

Accordingly, the substantial thickness of the dielectric of the capacitor 316 is a sum of an electrical thickness of the second insulator 307 and an electrical thickness of the semiconductor layer 306. For example, when the permittivities of the semiconductor layer 306 and the second insulator 307 are equal, if the thickness of the second insulator 307 is 2 nm but the thickness of the semiconductor layer 306 is 4 nm, the substantial thickness of the dielectric of the capacitor 316 is 6 nm; therefore the amount of tunneling current can be made sufficiently small.

Under this condition, electrons try to move from the reading word line 311 to the floating gate 303 through the second insulator 307 and the semiconductor layer 306, but in the junction portion of the reading word line 311 and the second insulator 307, a high-work-function oxynitride is used, and thus the potential barrier is 1.5 eV or higher. Therefore, a sufficient insulating property with the tunneling probability kept very low can be maintained.

On the other hand, in writing data, by setting the potential of the reading word line 311 to be higher than that of the semiconductor layer 306, an inversion layer (channel) may be formed in the semiconductor layer. The inversion layer has high conductivity and thus the potential of the bit line 315 is easily transmitted to the floating gate 303.

In order to decrease the amount of tunneling current between the writing word line 310 and the semiconductor layer 306, the potential of the writing word line 310 is preferably adjusted so that the semiconductor layer 306 is depleted in the vicinity of the writing word line 310 (at least in a region within 6 nm apart from the writing word line 310).

Embodiment 4

Figure 7A:
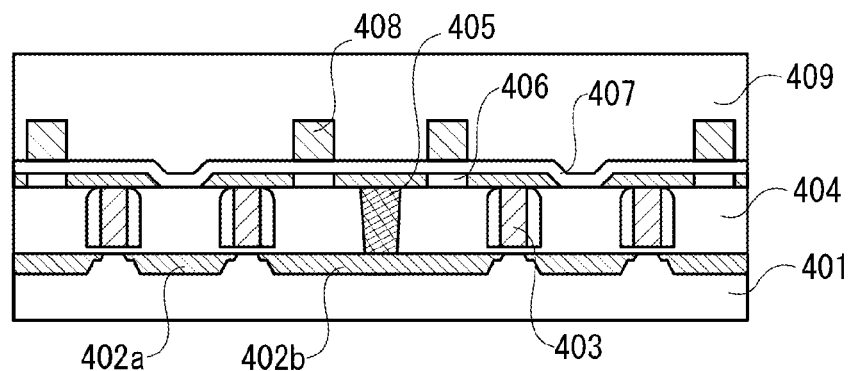
FIGS. 7A to 7C are cross-sectional views illustrating an example of a manufacturing method of a semiconductor device of the present invention.
Figure 7B:
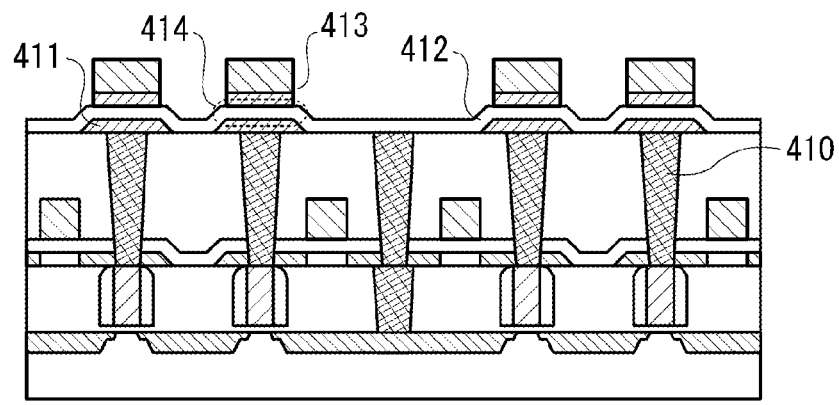
Figure 7C:
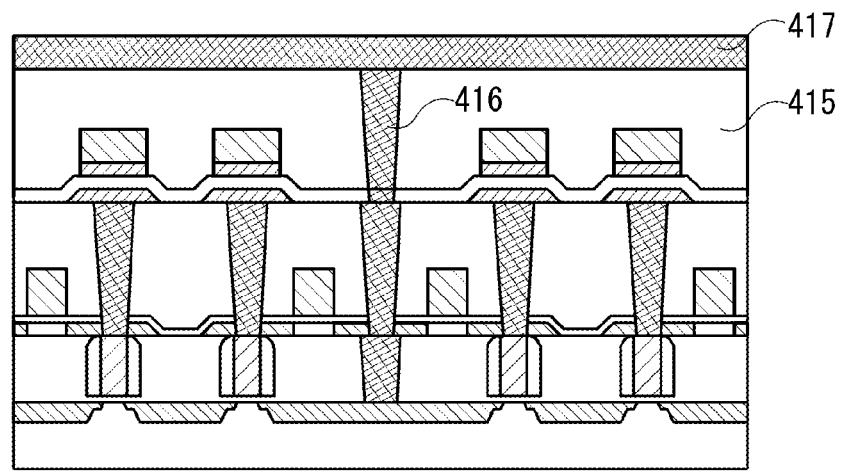

This embodiment is illustrated in FIGS. 7A to 7C. In this embodiment, similarly to Embodiment 3, a formation process of the memory cell illustrated in FIG. 6B will be described. Hereinafter, description is given with reference to the drawings. Embodiment 3 may be referred to for the details.

[FIG. 7A]

In accordance with the method and the like described in Embodiment 3, over a substrate 401, conductive regions 402a and 402b, a floating gate 403, a first insulator 404, a first contact plug 405, a semiconductor layer 406, a second insulator 407, a writing word line 408, and a third insulator 409 are formed. Here, the writing word line is not necessarily formed using a high-work-function compound semiconductor.

[FIG. 7B]

A second contact plug 410 connected to the floating gate 403 or the first contact plug 405 is formed. Further, a high-work-function oxynitride film 411 is formed so as to be in contact with some second contact plugs 410. For the formation method of the high-work-function oxynitride film 411, Embodiment 3 may be referred to.

In addition, a fourth insulator 412 is formed using a high-k material so as to cover the high-work-function oxynitride film 411. The fourth insulator 412 serves as a dielectric of the capacitor 414. The thickness may be from 5 nm to 10 nm. For the formation method thereof, Embodiment 1 to Embodiment 3 may be referred to.

Further, similarly to the writing word line 310 and the reading word line 311 in Embodiment 3, a reading word line 413 including a stacked layer of a high-work-function oxynitride film and a conductive film is formed over the fourth insulator 412. As a result, a capacitor 414 includes the fourth insulator 412, the reading word line 413, and the high-work-function oxynitride film 411.

[FIG. 7C]

A fifth insulator 415, a third contact plug 416 connected to the second contact plug 410 without the high-work-function oxynitride film 411 provided, and a bit line 417 connected to the third contact plug 416 are formed. The thusly formed memory cell has an area of $6 F^2$ to $9 F^2$ (F is a feature size).

This application is based on Japanese Patent Application serial no. 2011-020493 filed with Japan Patent Office on Feb. 2, 2011, the entire contents of which are hereby incorporated by reference.

What is claimed is:

1. A capacitor comprising:
a dielectric; and
an n-type semiconductor provided in contact with one surface of the dielectric,
wherein the n-type semiconductor includes nitrogen and at least one of indium, tin, and zinc, and
wherein the n-type semiconductor has a work function of 5.0 eV or higher.

2. The capacitor according to claim 1, wherein the n-type semiconductor has a work function of 5.5 eV or higher.

3. The capacitor according to claim 1, wherein the dielectric includes at least one material selected from the group consisting of strontium titanate, lead titanate, barium strontium titanate, lead zirconate, barium zirconate, tantalum oxide, strontium bismuth titanate, titanium oxide, zirconium oxide, hafnium oxide, aluminum oxide, yttrium oxide, lanthanum oxide, zirconium silicate, and hafnium silicate.

4. The capacitor according to claim 1, wherein the dielectric is an oxide of at least one metal selected from the group consisting of strontium, titanium, barium, zirconium, lead, tantalum, bismuth, hafnium, aluminum, yttrium, and lanthanum, which is included at 50% or higher of metal elements constituting the dielectric.

5. The capacitor according to claim 1, wherein the thickness of the n-type semiconductor is from 4 nm to 10 nm.

6. The capacitor according to claim 1, wherein the n-type semiconductor includes nitrogen at a concentration of from 5 at. % to 50 at. %.

7. A semiconductor device comprising:
a dielectric;
an n-type semiconductor provided in contact with one surface of the dielectric; and
a conductive material provided on another surface of the dielectric opposite to the n-type semiconductor,
wherein the n-type semiconductor includes nitrogen and at least one of indium, tin, and zinc, and
wherein the n-type semiconductor has a work function of 5.0 eV or higher.

8. The semiconductor device according to claim 7, wherein the n-type semiconductor has a work function of 5.5 eV or higher.

9. The semiconductor device according to claim 7, wherein the dielectric includes at least one material selected from the group consisting of strontium titanate, lead titanate, barium strontium titanate, lead zirconate, barium zirconate, tantalum oxide, strontium bismuth titanate, titanium oxide, zirconium oxide, hafnium oxide, aluminum oxide, yttrium oxide, lanthanum oxide, zirconium silicate, and hafnium silicate.

10. The semiconductor device according to claim 7, wherein the dielectric is an oxide of at least one metal selected from the group consisting of strontium, titanium, barium, zirconium, lead, tantalum, bismuth, hafnium, aluminum, yttrium, and lanthanum, which is included at 50% or higher of metal elements constituting the dielectric.

11. The semiconductor device according to claim 7, wherein the thickness of the n-type semiconductor is from 4 nm to 10 nm.

12. The semiconductor device according to claim 7, wherein the n-type semiconductor includes nitrogen at a concentration of from 5 at. % to 50 at. %.

13. A semiconductor device comprising:
an insulator;
an n-type semiconductor film provided on a side surface of the insulator; and
a dielectric film formed over the n-type semiconductor film,
wherein the n-type semiconductor film includes nitrogen and at least one of indium, tin, and zinc, and
wherein the n-type semiconductor film has a work function of 5.0 eV or higher.

14. The semiconductor device according to claim 13, wherein the n-type semiconductor film has a work function of 5.5 eV or higher.

15. The semiconductor device according to claim 13, wherein the dielectric film includes at least one material selected from the group consisting of strontium titanate, lead titanate, barium strontium titanate, lead zirconate, barium zirconate, tantalum oxide, strontium bismuth titanate, titanium oxide, zirconium oxide, hafnium oxide, aluminum oxide, yttrium oxide, lanthanum oxide, zirconium silicate, and hafnium silicate.

16. The semiconductor device according to claim 13, wherein the dielectric film is an oxide of at least one metal selected from the group consisting of strontium, titanium, barium, zirconium, lead, tantalum, bismuth, hafnium, aluminum, yttrium, and lanthanum, which is included at 50% or higher of metal elements constituting the dielectric film.

17. The semiconductor device according to claim 13, wherein the thickness of the n-type semiconductor film is from 4 nm to 10 nm.

18. The semiconductor device according to claim 13, wherein the n-type semiconductor film includes nitrogen at a concentration of from 5 at. % to 50 at. %.

* * * * *